(12) United States Patent
Vallet

(10) Patent No.: US 6,175,240 B1
(45) Date of Patent: Jan. 16, 2001

(54) PROCEDURE AND APPARATUS FOR MEASURING THE DC VOLTAGE OF CIRCUITS BY APPLYING A PULSED VOLTAGE AND ELECTRON BEAM

(75) Inventor: Michel Vallet, Vaulnaveys le Haut (FR)

(73) Assignee: STMicroelectronics S.A., Gentilly (FR)

( * ) Notice: Under 35 U.S.C. 154(b), the term of this patent shall be extended for 0 days.

(21) Appl. No.: 09/169,356

(22) Filed: Oct. 9, 1998

(30) Foreign Application Priority Data

Oct. 24, 1997 (FR) .................................................. 97 13372

(51) Int. Cl.[7] .................................................... G01R 31/00
(52) U.S. Cl. ...................... 324/751; 324/752; 324/158.1
(58) Field of Search ................................... 324/751, 752, 324/158.1, 71.3

(56) References Cited

U.S. PATENT DOCUMENTS

| | | | |
|---|---|---|---|
| 3,531,716 | * | 9/1970 | Tarui et al. ........................ 324/158.1 |
| 5,093,616 | * | 3/1992 | Seitoh et al. ...................... 324/158.1 |
| 5,416,426 | * | 5/1995 | Okubo et al. ......................... 324/751 |

FOREIGN PATENT DOCUMENTS 62-200739 * 9/1987 (JP) ............................... H01L/21/66

OTHER PUBLICATIONS

Patent Abstracts of Japan, vol. 12, No. 54, Feb. 18, 1988, and JP 62 200739 A (Hitachi), Sep. 4, 1987.
Patent Abstracts of Japan, vol. 15, No. 482, Dec. 6, 1991, and JP 03 209739 A (Mitsubishi Electric Corp.), Sep. 12, 1991.
"E–Beam Measurements of DC Voltages by Pseudo–Waveform Method," IBM Technical Disclosure Bulletin, vol. 32, No. 5B, Oct. 1, 1989, pp. 231–232.
E. Menzel, "*Electron Beam Testing Techniques*," Microelectronic Engineering, vol. 16, No. 1/4, Mar. 1, 1992, pp. 3–14.

* cited by examiner

*Primary Examiner*—Safet Metjahic
*Assistant Examiner*—Jimmy Nguyen
(74) *Attorney, Agent, or Firm*—Theodore E. Galanthay; Allen, Dyer, Doppelt, Milbrath & Gilchrist, P.A.

(57) ABSTRACT

DC voltage levels applied to an integrated circuit are measured using an electron beam. A pulsed signal having a peak voltage dependent upon or representing one of the DC voltage level applied to the integrated circuit is first generated. The pulsed signal is applied to a test zone, and the voltage of the test zone varies according to the pulsed signal. The DC voltage level applied to the test zone on the integrated circuit transforms into a pulsed voltage. An electron beam is then used to measure the voltage of the test zone.

20 Claims, 6 Drawing Sheets

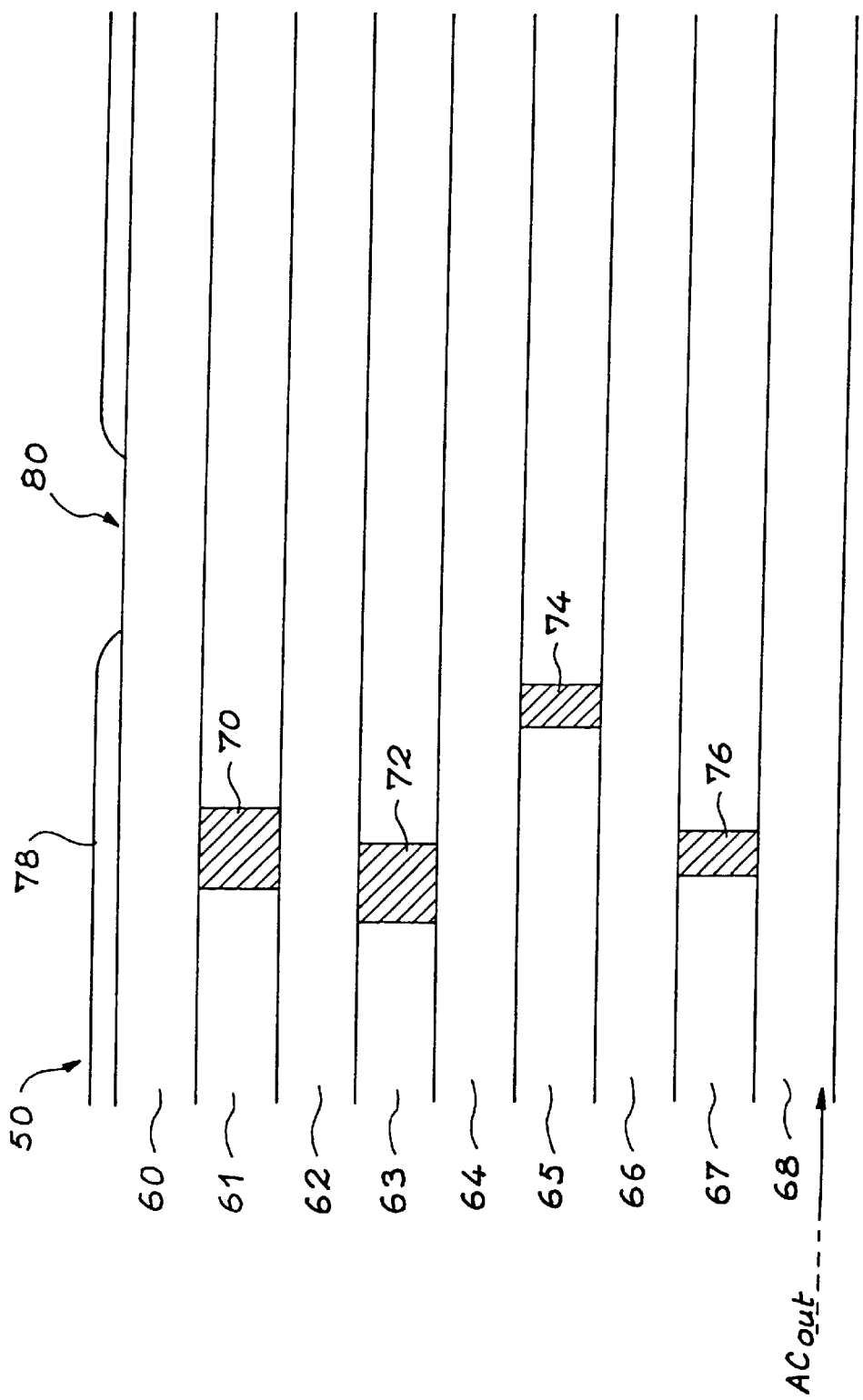

PROCEDURE AND APPARATUS FOR MEASURING THE DC VOLTAGE OF CIRCUITS BY APPLYING A PULSED VOLTAGE AND ELECTRON BEAM

FIELD OF THE INVENTION

The present invention relates to integrated electronic circuits, and more particularly, to a method of testing integrated electronic circuits using an electron beam, and related devices.

BACKGROUND OF THE INVENTION

Using an electron beam for testing integrated circuits is described in an article by E. Menzel et al., entitled "Electron Beam Testing Techniques," published in Microelectronics Engineering, Volume 16, pp. 3–14, March 1992. The article discloses how to direct an electron beam onto an energized circuit, which produces secondary electrons that can be detected when they are emitted by the material of which the circuit is composed. A suitable algorithm is then used to determine a surface voltage of the circuit.

The principle by which an electron beam 2 of energy $E_0$ interacts with a substrate 4 is described with reference to FIGS. 1 and 2. The energy $E_0$ enables the beam to penetrate the surface of substrate 4 to a given depth. The interaction between the electrons and the material causes an emission of photons 6 and an emission of secondary electrons 8. The spectrum of the electrons emitted (see FIG. 2) includes, in addition to an elastic peak 10 at the value of the incident energy $E_0$, Auger electrons 12 and secondary electrons 14.

In practice, a substrate 4 is tested with an electron beam 2 using the apparatus or scanning electron microscope shown in FIG. 3. An electron gun 16 generates electron beam 2 that passes successively through electronic lenses 18 and beam deflection means 20. The secondary electrons 8 are detected by a detector 22, the signal of which is shown on display means 24 after processing by suitable processing means 26. Synchronization means 27 synchronizes the signals applied to deflection coils 20 and display means 24.

This type of apparatus displays differences in potentials on the surface of substrate 4. Qualitative measurements of differences in potentials can be made as described below with reference to FIG. 4. The surface of substrate 4 includes conducting tracks 28, 30, 32 that are at different potentials. For example, track 30 is at a potential of 5 volts while tracks 28 and 32 are maintained at a potential of 0 volts. A primary electron beam 2 is focused on track 30 which causes emission of secondary beams 8. A primary electron beam 32 is focused on track 28 and produces a beam of secondary electrons 38.

The potential distribution at the surface of substrate 4 determines the distribution of equipotential surfaces above this substrate 4. In FIG. 4, equipotential surfaces with values of 1 volt, 2 volts, 3 volts, 4 volts and 5 volts are shown. The shape of these equipotentials shows that only electrons with sufficient energy can escape towards the detector corresponding to track 30. A potential barrier, which is shown as reference 34, is established at a value determined by the value of the potential at the surface of substrate 4.

In the example given above, the potential barrier 34 is at approximately 3.5 volts when track 30 has a potential of 5 volts. Consequently, only electrons of energy greater than 1.5 eV can join secondary beam 8 and be detected. Track 28 is maintained at a potential of 0 volts, and no barrier effect is created. All secondary electrons, irrespective of their energy, can join secondary beam 38.

Various forms of secondary electron spectra are possible. In the case of track 30, which has a potential of 5 volts, the low energy section of the spectrum has a break at approximately 1.5 eV (see FIG. 5A). In track 28, which has a potential of 0 volts, no break appears (see FIG. 5B). If the development in the intensity of the signal of detector 22 is plotted against the potential V in volts of the track being tested, a curve illustrated in FIG. 5C is obtained for a given electrical environment. The lower the potential of the track, the more powerful the signal detected.

According to one variation of the apparatus shown in FIG. 6, an electrostatic filter is placed in the path of the secondary electrons and is increased to a potential $V_f$. The track is at a potential $V_p$ and the electrons need sufficient energy to pass not only through the extraction barrier (potential $V_{ext}$), but also the electrostatic barrier (potential $V_f$). Once the electrons have passed through the filter, they are accelerated in the direction of the detector 8. The detector 8 supplies a signal of intensity I that is based upon the difference $V_p - V_f$.

It is not feasible to measure continuous voltage levels with such a conventional electron beam apparatus. For example, it is impossible to measure DC voltages on the power supply rail of a circuit. Only measurements of variations in surface potentials between one point and another on the surface of a substrate or integrated circuit are measured. In addition, only variations in potential at a given point on the surface from one moment to the next are measured.

Movement of an electron beam from one point to another is electronically controlled using a suitable program. Furthermore, the apparatus only uses a single measuring channel. Measuring between two points on the surface of a circuit involves three main steps: 1) a measurement is taken at a first point using an apparatus with a single measuring channel, and a corresponding waveform is observed while scales on the order of a few nanoseconds per division are commonly used for this waveform; 2) the first point is slowly moved to a second measuring point; and 3) a second measurement is taken when the beam is in position on the second point. A measurement of the relative phase variations between the two points is thus obtained.

To measure DC voltage levels, a mechanical probe is brought into contact with the conducting track. Consequently, there is a risk in this technique of causing damage to the circuit. Measurements obtained with a mechanical probe (for DC voltage levels) are combined with measurements made using an electron beam (for measuring differences in voltage on the surface of a circuit) to test circuits housed in a unit. Therefore, a problem arises to find a method and an apparatus that can test DC voltage levels in a circuit that avoids physical contact with the circuit.

SUMMARY OF THE INVENTION

An object of the invention is to provide an apparatus and a method for testing potential levels of integrated circuits using a beam of electrons.

In one embodiment, a method for measuring a DC voltage level applied to an integrated circuit is provided in which a pulsed signal having a peak voltage dependent upon or representing the DC voltage is generated. The pulsed signal is applied to a test zone, and the voltage of the test zone varies according to the pulsed signal. An electron beam is then used to measure the voltage of the test zone. This method transforms the DC voltage applied to a zone of an integrated circuit into a pulsed voltage. It is then possible to take measurements using an electron beam as described above.

In other embodiments of the invention, the DC voltage is applied to reversing means controlled by a clock. Also, the test zone of the integrated circuit does not have a surface passivation layer. The integrated circuit is constructed using CMOS technology.

A further embodiment of the invention is an apparatus for measuring a DC voltage level of an integrated circuit. The apparatus comprises means for creating a DC voltage, reversing means powered by the means for creating a DC voltage, and means for supplying the reversing circuit with a pulsed signal. The reversing circuit produces voltage pulses having a maximum amplitude corresponding to the DC voltage. The apparatus also comprises contact means for transmitting a pulsed signal produced by the reversing circuit to an integrated circuit. The means for creating a DC voltage and the reversing means are in the form of a common integrated circuit.

BRIEF DESCRIPTION OF THE DRAWINGS

The characteristics and advantages of the present invention are better understood from the following description. The description is of non-limitative embodiments and refers to the attached Figures, where:

FIG. 9 illustrates a cross-section of an integrated circuit in which a measuring procedure according to the invention is applied.

DETAILED DESCRIPTION OF THE PREFERRED EMBODIMENTS

Figure 7:
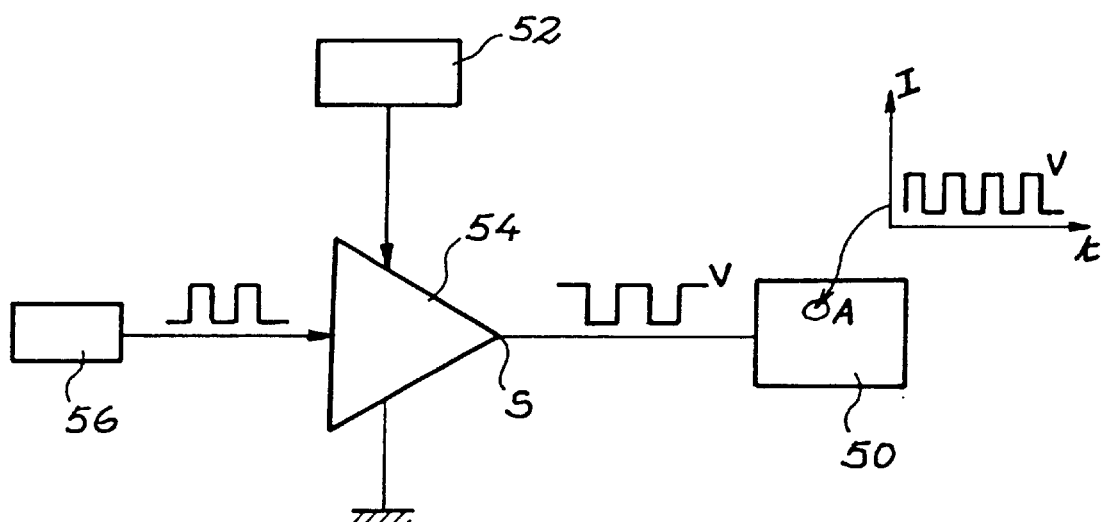
FIG. 7 illustrates the principle of a measuring procedure according to the invention.

FIG. 7 illustrates a measuring procedure of the invention, wherein reference 50 is a circuit to be tested. A DC current is applied by a power source 52 to an inverter 54. The power source 52 may be a voltage generator. Power source 52 is the biasing source of inverter 54. Pulses generated by clock 56 are also applied to an input of the inverter 54. Inverter 54 thus produces a signal 60 at its output S. The pulses of the signal 60 are at the same frequency as those provided by the clock 56, but of an amplitude V. Amplitude V is substantially equal to the voltage supplied by power source 52.

Figure 1:
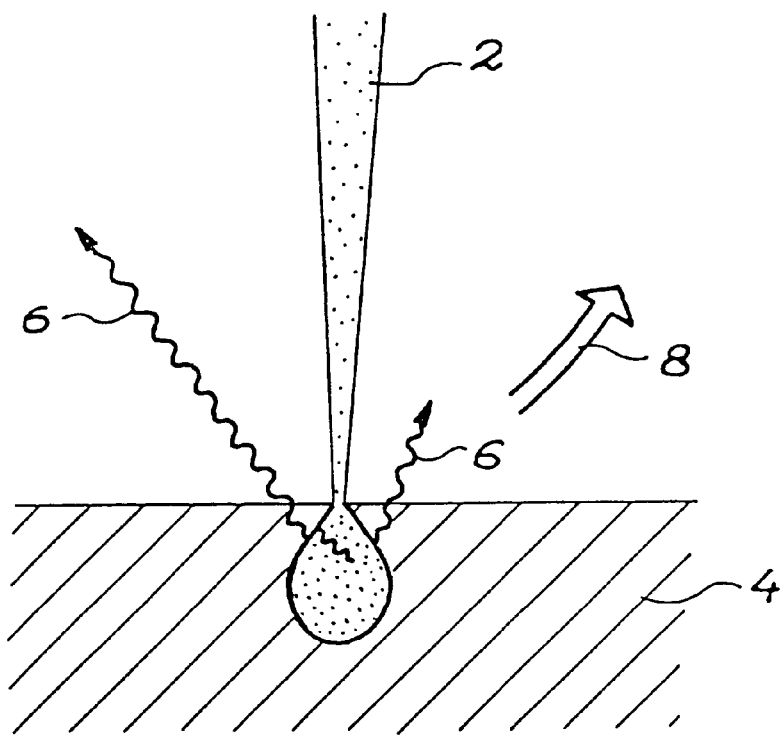
FIGS. 1 and 2 illustrate the phenomena that occurs during the interaction between a beam of electrons and a substrate as in the prior art.
Figure 2:
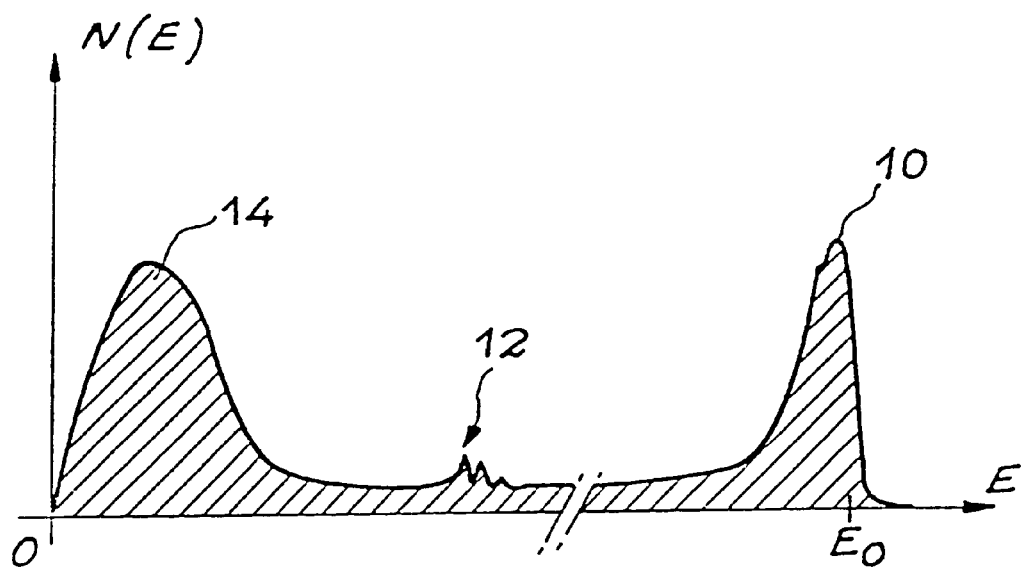
Figure 3:
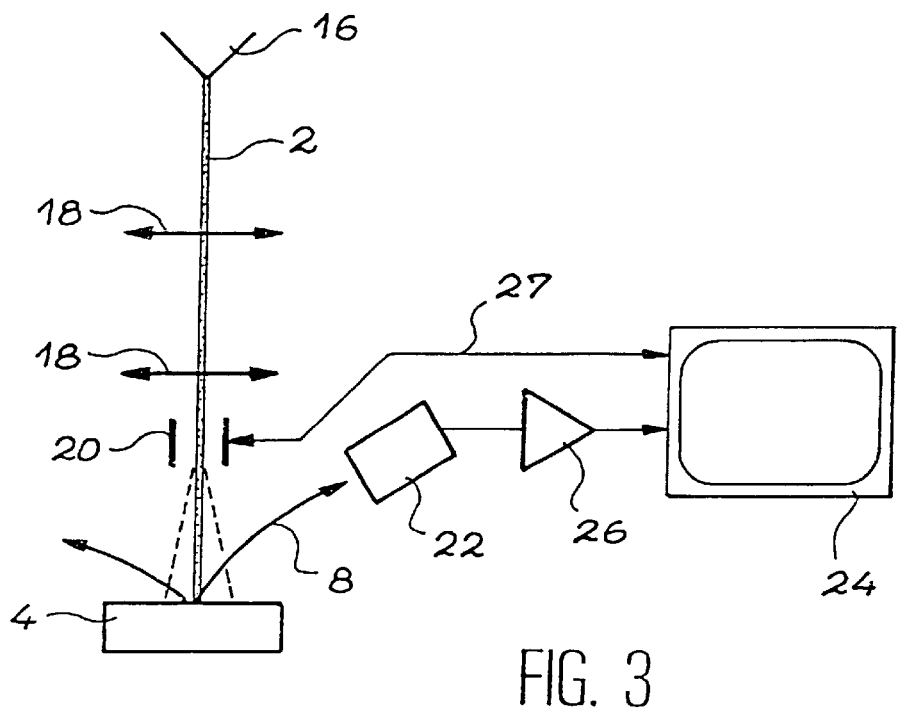
FIG. 3 illustrates a scanning electron microscope apparatus according to the prior art.
Figure 4:
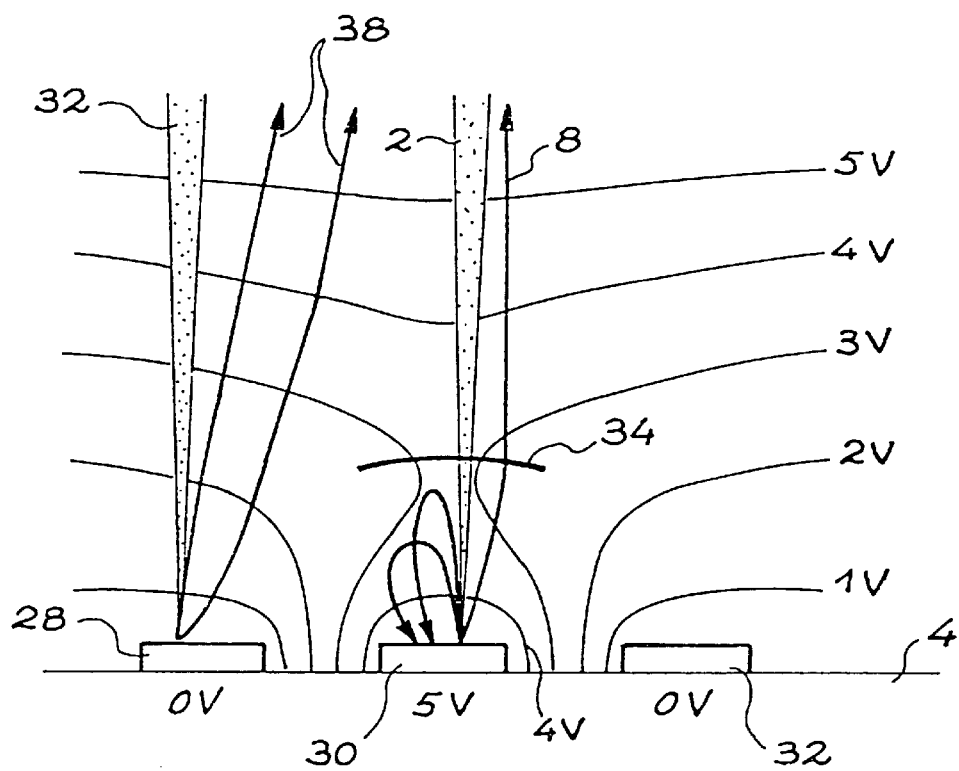
FIG. 4 illustrates the principle of using an electron beam to take surface measurements of a substrate fitted with conducting tracks as in the prior art.
Figure 5A:
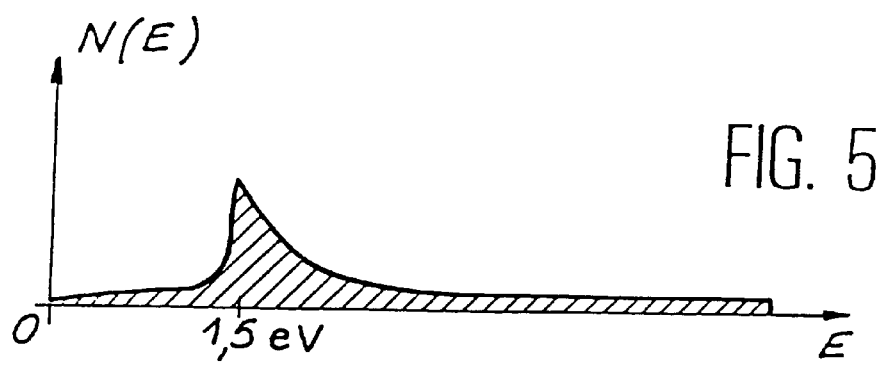
FIGS. 5A to 5C illustrate secondary electron spectrums and the signal of a detector that is a function of the surface voltage of a substrate as in the prior art.
Figure 5B:
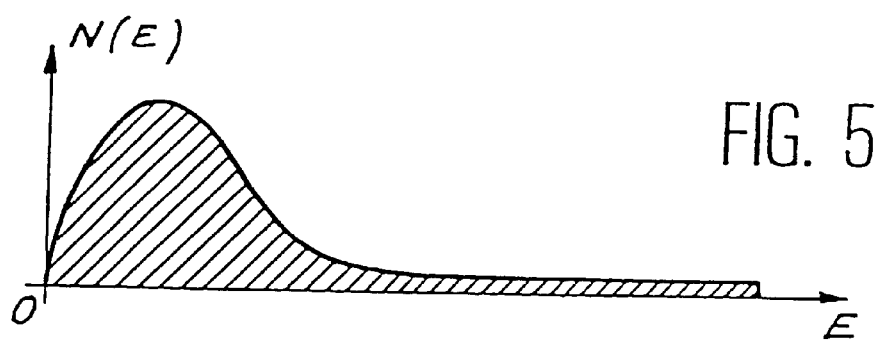
Figure 5C:
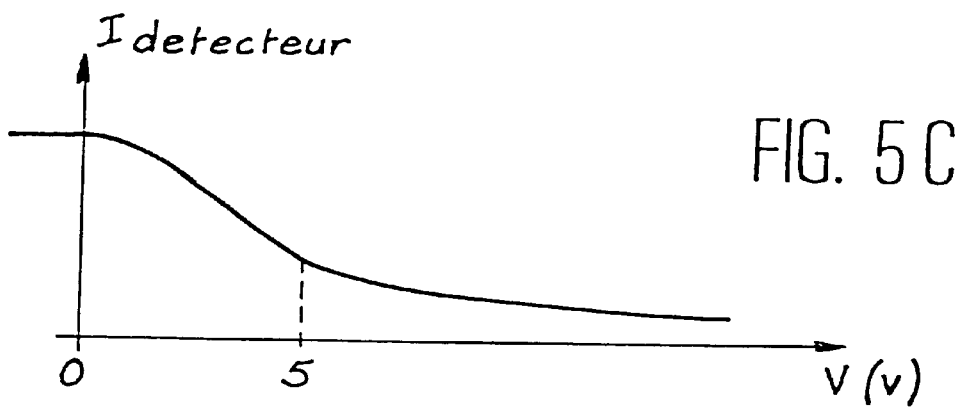
Figure 6:
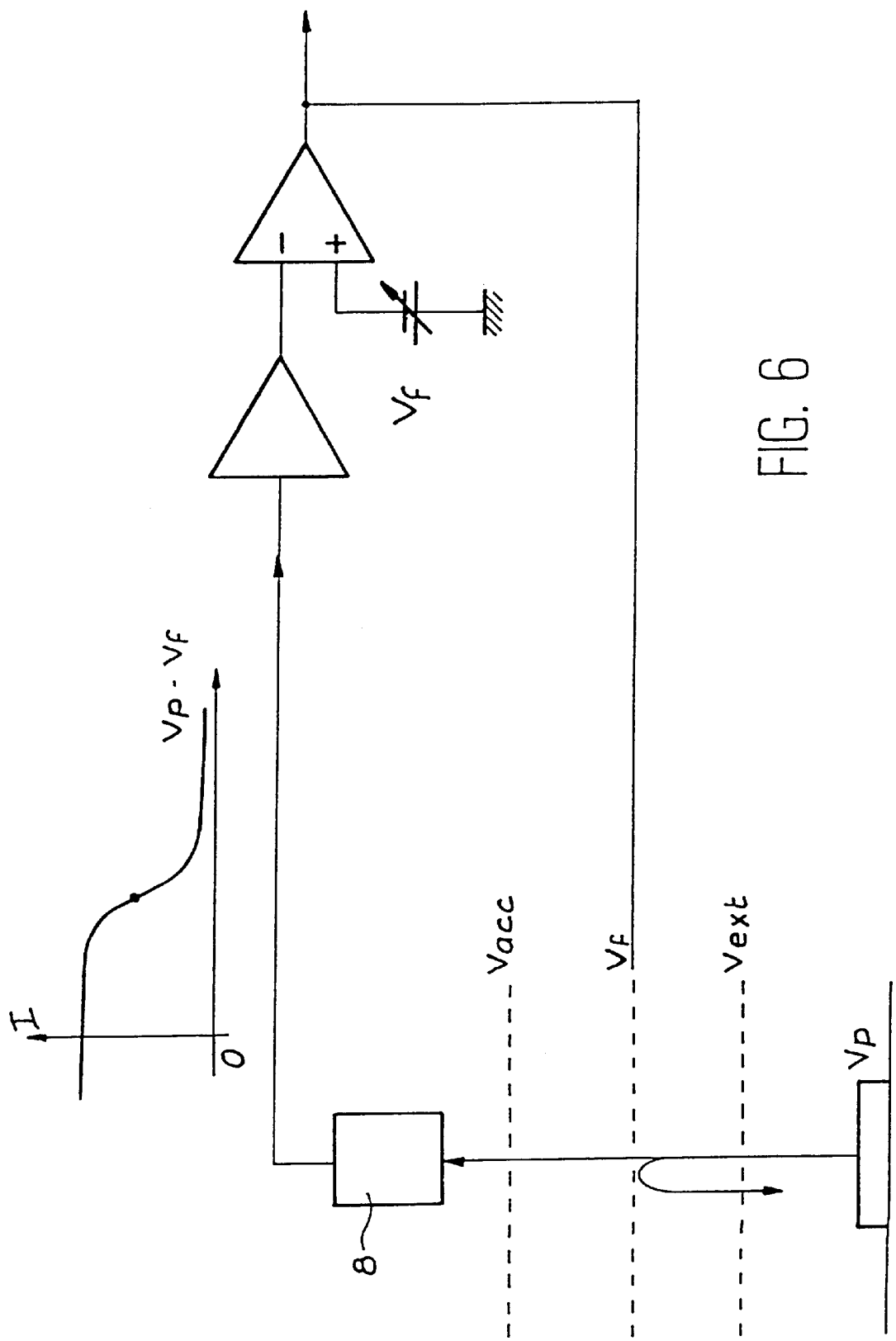
FIG. 6 illustrates another measuring technique according to the prior art.

The pulsed voltage having amplitude V is applied to zone A of the circuit 50 to be tested. Any passivation layer is first removed before testing. An electron beam is then applied to the zone to be tested and a measurement is taken. For example, this measurement is performed as described above with reference to FIG. 3. The signal supplied by the secondary electron detector has a shape shown in FIG. 7. Intensity I consists of a pulse train at the frequency set by clock 56. The amplitude of this signal corresponds to the voltage V supplied by power source 52 if the circuit is operating correctly. If the zone to be tested is faulty, the amplitude of the signal supplied by the secondary electron detector will be greater. This has been explained above with reference to FIG. 5C.

Figure 8:
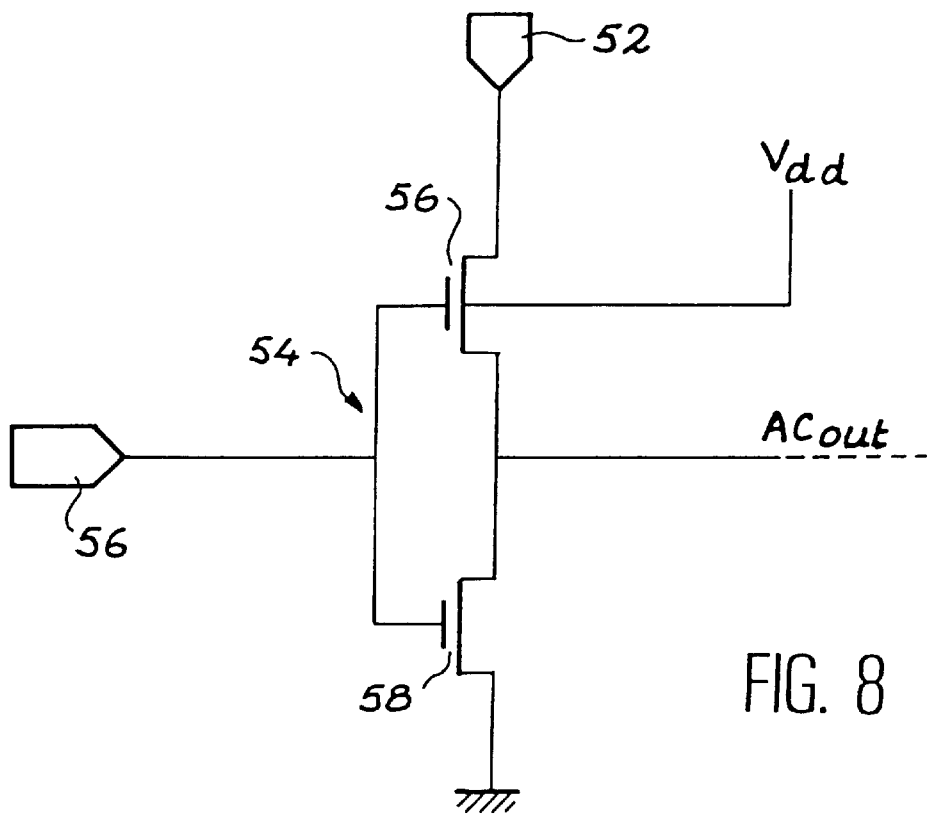
FIG. 8 illustrates a reversing apparatus according to the invention.

FIG. 8 is a detailed diagram of an inverter 54 that is used according to the present invention. Reference numbers in FIG. 8 that are the same as those in FIG. 7 are used to indicate the same or corresponding components. The inverter 54 includes first and second MOS transistors 57, 58. The body of transistor 57 is at a voltage $V_{dd}$ and its source is connected to voltage generator 52. Clock 56 delivers pulses to the drains of both transistors 57, 58. Transistor 58 does not conduct during the pulse trough.

In contrast, transistor 57 conducts during the pulse trough. The output voltage $AC_{out}$ is therefore at a high level which is determined by the voltage level supplied by power source 52. Transistor 58 conducts during the clock pulse peak. In contrast, transistor 57 does not conduct during the clock pulse peak. The output voltage $AC_{out}$ is then at the low level.

The invention may, for example, be applied to a circuit 50 having a certain number of metallic areas insulated from one another by oxide layers. For example, 5 to 6 metallic levels are interconnected by tungsten conductor tracks in the oxide layers. This type of circuit may be a DRAM connected to several fixed voltage generators which are on the order of 2 or 2.5 volts. The procedure of the invention can be used to test whether the voltage in a specific zone of the circuit corresponds to the voltage supplied by one or other of the voltage generators.

FIG. 9 shows a cross-section of an integrated circuit 50 with five metallic layers 60, 62, 64, 66, 68. Insulating layers 61, 63, 65, 67 separate adjacent conducting layers. Tungsten connections 70, 72, 74, 76 pass through the layers. Upper layer 60 is covered by a passivation layer 78 in which a test zone 80 has been etched.

The pulse train supplied by inverter 54 is applied to lower layer 68. If the circuit 50 is operating correctly, the same pulse train will be detected in conducting layer 60 under zone 80. Voltage is measured in this area of track 60 using an electron beam. No contact measuring technique is required.

The inverter 54 illustrated in FIG. 8 is formed as an integrated circuit that comprises the inverter 54, power source 52 and clock 56. This assembly is produced when the corresponding integrated circuit to be tested is produced. The assembly and the integrated circuit can then be combined. The apparatus is then used for technical monitoring to keep track of production procedures. The measuring apparatus remains the same irrespective of the procedure used. This type of apparatus may also be used for validating and carrying out fine, internal characterization procedures on prototype circuits.

That which is claimed is:

1. A method for measuring DC voltage levels applied to an integrated circuit, comprising the steps of:
   using an inverter to generate a pulsed signal having a peak voltage not greater than a DC voltage applied to the integrated circuit;
   applying the pulsed signal to a test zone on the integrated circuit so that a voltage level of the test zone varies according to the pulsed signal; and
   measuring the voltage level of the test zone using an electron beam.

2. A method according to claim 1, wherein the input pulsed signal is generated by a clock.

3. A method according to claim 1, wherein the test zone does not have a surface passivation layer.

4. A method according to claim 1, wherein the integrated circuit being tested is constructed using CMOS technology.

5. A method according to claim 1, wherein the integrate circuit being tested comprises a plurality of metallic layers separated by a plurality of oxide layers.

6. A method for measuring DC voltage levels of an integrated circuit, comprising the steps of:

applying an input pulsed signal to an inverter;

applying a DC voltage to the inverter for generating a pulsed signal having a peak voltage not greater than the DC voltage;

applying the pulsed signal to a test zone on the integrated circuit so that a voltage level of the test zone varies according to the pulsed signal; and measuring the voltage level of the test zone using an electron beam.

7. A method according to claim 6, wherein the input pulsed signal is generated by a clock.

8. A method according to claim 6, wherein the test zone does not have a surface passivation layer.

9. A method according to claim 6, wherein the integrated circuit being tested is constructed using CMOS technology.

10. A method according to claim 6, wherein the integrated circuit being tested comprises a plurality of metallic layers separated by a plurality of oxide layers.

11. An apparatus for measuring DC voltage levels of an integrated circuit, comprising:

a circuit for providing a DC voltage;

an inverter powered by the circuit for providing the DC voltage;

a circuit for providing an input pulsed signal to the inverter for causing the inverter to generate voltage pulses having a peak voltage not greater than the DC voltage; and a contact for transmitting the voltage pulses to an integrated circuit.

12. An apparatus according to claim 11, wherein the integrated circuit comprises a test zone for receiving the voltage pulses so that a voltage level of the test zone varies according to the voltage pulses.

13. An apparatus according to claim 12, further comprising an electron beam generator and detector for measuring the voltage level of the test zone using an electron beam.

14. An apparatus according to claim 11, wherein the inverter comprises:

a first transistor; and a second transistor having a source connected to a drain of the first transistor.

15. An apparatus according to claim 14, wherein the circuit for providing a DC voltage is connected to a source of the first transistor.

16. An apparatus according to claim 14, wherein the circuit for providing an input pulsed signal is connected to a gate of the first and second transistors.

17. An apparatus according to claim 11, wherein the circuit for providing an input pulsed signal comprises a clock.

18. An apparatus according to claim 11, wherein the circuit for providing a DC voltage and the inverter are formed as an integrated circuit.

19. An apparatus for measuring DC voltage levels of an integrated circuit, comprising:

a DC voltage source;

a clock for providing an input pulsed signal;

an inverter powered by the DC voltage source and receiving the input pulsed signal for generating voltage pulses having a peak voltage not greater than the DC voltage;

a contact for transmitting the voltage pulses to a test zone on the integrated circuit so that a voltage level of the test zone varies according to the voltage pulses; and an electron beam generator and detector for measuring the voltage level of the test zone.

20. An apparatus according to claim 19, wherein the DC voltage source and the inverter are formed as an integrated circuit.

* * * * *